(12) United States Patent
Savlers et al.

(10) Patent No.: US 11,686,536 B2
(45) Date of Patent: Jun. 27, 2023

(54) THREE-DIMENSIONAL DIFFUSER-FIN HEAT SINK WITH INTEGRATED BLOWER

(71) Applicant: Raytheon Technologies Corporation, Farmington, CT (US)

(72) Inventors: Kimberly Rae Savlers, Glastonbury, CT (US); Matthew Robert Pearson, Hartford, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 82 days.

(21) Appl. No.: 17/171,389

(22) Filed: Feb. 9, 2021

(65) Prior Publication Data

US 2022/0252359 A1 Aug. 11, 2022

(51) Int. Cl.
*F28F 3/02* (2006.01)
*H01L 23/467* (2006.01)
*F28F 13/06* (2006.01)

(52) U.S. Cl.
CPC ............... *F28F 3/02* (2013.01); *F28F 13/06* (2013.01); *H01L 23/467* (2013.01); *F28F 2215/08* (2013.01)

(58) Field of Classification Search
CPC .......... F28F 3/02; F28F 13/06; F28F 2215/04; F28F 2250/08; F28F 3/048; F28F 3/06; F28F 2215/00; F28F 2215/08; F28F 2215/10; F28F 2215/12; H01L 23/467; F28D 2021/0029
See application file for complete search history.

(56) References Cited

U.S. PATENT DOCUMENTS

| | | | |
|---|---|---|---|
| 5,409,352 A * | 4/1995 | Lin | F04D 29/582 257/722 |
| 5,661,638 A * | 8/1997 | Mira | H01L 23/467 165/126 |
| 6,015,008 A * | 1/2000 | Kogure | H01L 23/3672 257/722 |
| 6,419,007 B1 * | 7/2002 | Ogawara | H01L 23/467 257/722 |
| 6,659,169 B1 * | 12/2003 | Lopatinsky | H01L 23/467 257/E23.099 |
| 6,789,610 B1 * | 9/2004 | Hegde | H01L 23/467 165/80.4 |
| 6,945,315 B1 | 9/2005 | Gektin et al. | |
| 9,909,591 B2 * | 3/2018 | Tamaoka | F04D 29/063 |
| 2003/0007867 A1 * | 1/2003 | Chang | H01L 23/467 257/E23.099 |
| 2005/0045308 A1 * | 3/2005 | Wang | F28D 15/0233 257/E23.099 |
| 2010/0170657 A1 * | 7/2010 | Kaslusky | H05K 7/20163 165/80.3 |
| 2010/0310391 A1 * | 12/2010 | Cao | F04D 19/002 417/423.7 |

(Continued)

*Primary Examiner* — Tho V Duong
(74) *Attorney, Agent, or Firm* — Cantor Colburn LLP

(57) ABSTRACT

A heat exchanger system is provided and includes a heat sink, fins arrayed on a central region of the heat sink to form channels between adjacent fins and an integrated blower. Each of the fins extends radially outwardly from the central region and has a height that increases with increasing distance from the central region. The integrated blower is disposed at the central region to generate flows of coolant directed into and through the channels.

18 Claims, 3 Drawing Sheets

(56) References Cited

U.S. PATENT DOCUMENTS

2011/0233288 A1     9/2011   Kaslusky et al.
2014/0290925 A1*   10/2014   Hernon .................. B23P 15/26
                                                                 165/185
2015/0330718 A1    11/2015   St. Rock et al.

* cited by examiner

THREE-DIMENSIONAL DIFFUSER-FIN HEAT SINK WITH INTEGRATED BLOWER

BACKGROUND

The present disclosure relates to heat sinks and, in particular, a three-dimensional (3D) diffuser-fin heat sink with an integrated blower.

Aerospace applications often require efficient and targeted thermal management solutions. Reducing power consumption, weight and size of these solutions often has appreciable impact on aircraft fuel burn. Heat rejection technology continues to develop as additive manufacturing has enabled more unique and irregular geometries that were not previously feasible with conventional manufacturing.

BRIEF DESCRIPTION

According to an aspect of the disclosure, a heat exchanger system is provided and includes a heat sink, fins arrayed on a central region of the heat sink to form channels between adjacent fins and an integrated blower. Each of the fins extends radially outwardly from the central region and has a height that increases with increasing distance from the central region. The integrated blower is disposed at the central region to generate flows of coolant directed into and through the channels.

In accordance with additional or alternative embodiments, a cover plate encloses the channels.

In accordance with additional or alternative embodiments, the fins are arranged in a spiraling formation.

In accordance with additional or alternative embodiments, the integrated blower includes a radial blower.

In accordance with additional or alternative embodiments, the integrated blower has a height that is similar to or in excess of respective heights of the fins at the central region.

In accordance with additional or alternative embodiments, the height of the integrated blower does not exceed a maximum height of any of the fins.

In accordance with additional or alternative embodiments, a motor is packaged around an upper portion of the integrated blower to drive operations of the integrated blower.

In accordance with additional or alternative embodiments, the integrated blower includes an inlet which extends along a substantial height of the integrated blower.

In accordance with additional or alternative embodiments, one or more baffles are disposed to extend between one or more of the adjacent fins.

In accordance with additional or alternative embodiments, at least one or more of the fins includes one or more surface features to thermally interact with the flows of the coolant.

According to an aspect of the disclosure, a heat exchanger system is provided and includes a heat sink having a surface with a central region and a periphery, fins arrayed on the surface to form channels between adjacent fins and an integrated blower. Each of the fins extend along the surface from the central region toward the periphery and has a height that is defined in a direction normal to the surface and increases with increasing distance from the central region such that the channels extend along the surface from the central region toward the periphery and increase in height from the surface with increasing distance from the central region. The integrated blower is disposed at the central region to generate flows of coolant directed into and through the channels.

In accordance with additional or alternative embodiments, a cover plate encloses the channels.

In accordance with additional or alternative embodiments, the fins are arranged in a spiraling formation.

In accordance with additional or alternative embodiments, the integrated blower includes a radial blower.

In accordance with additional or alternative embodiments, the integrated blower has a height that is similar to or in excess of respective heights of the fins at the central region.

In accordance with additional or alternative embodiments, the height of the integrated blower does not exceed a maximum height of any of the fins.

In accordance with additional or alternative embodiments, a motor is packaged around an upper portion of the integrated blower to drive operations of the integrated blower.

In accordance with additional or alternative embodiments, the integrated blower includes an inlet which extends along a substantial height of the integrated blower.

In accordance with additional or alternative embodiments, one or more baffles are disposed to extend between one or more of the adjacent fins.

In accordance with additional or alternative embodiments, at least one or more of the fins includes one or more surface features to thermally interact with the flows of the coolant.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, a micro air-cooled exchanger (MACE), which can exchange heat with a second air stream, a gas, a liquid, a two-phase fluid, a solid heat-generating component or some combination of these, is provided in a package with a diffuser-fin heat exchanger with an integrated blower. The diffuser-fin heat exchanger allows the MACE to take advantage of diffusion in both in-plane and vertical directions along a flow path. The MACE can have any one or more of multiple configurations such as a heat sink configuration in which the MACE is mounted directly on a conductive heat load, a liquid cooling configuration in which the MACE is mounted on a liquid plate, a two-phase cooling configuration in which the MACE is mounted on a refrigerant plate, a double-sided heat exchanger configuration in which a liquid or refrigerant plate includes a MACE on both a top and a bottom of the plate, a heat pump configuration in which two MACE heat sinks are assembled with thermoelectrics to create an efficient heat pump package and a volute configuration for cooling applications in which a volute collects outlet coolant to duct to the cooled space.

Figure 1:
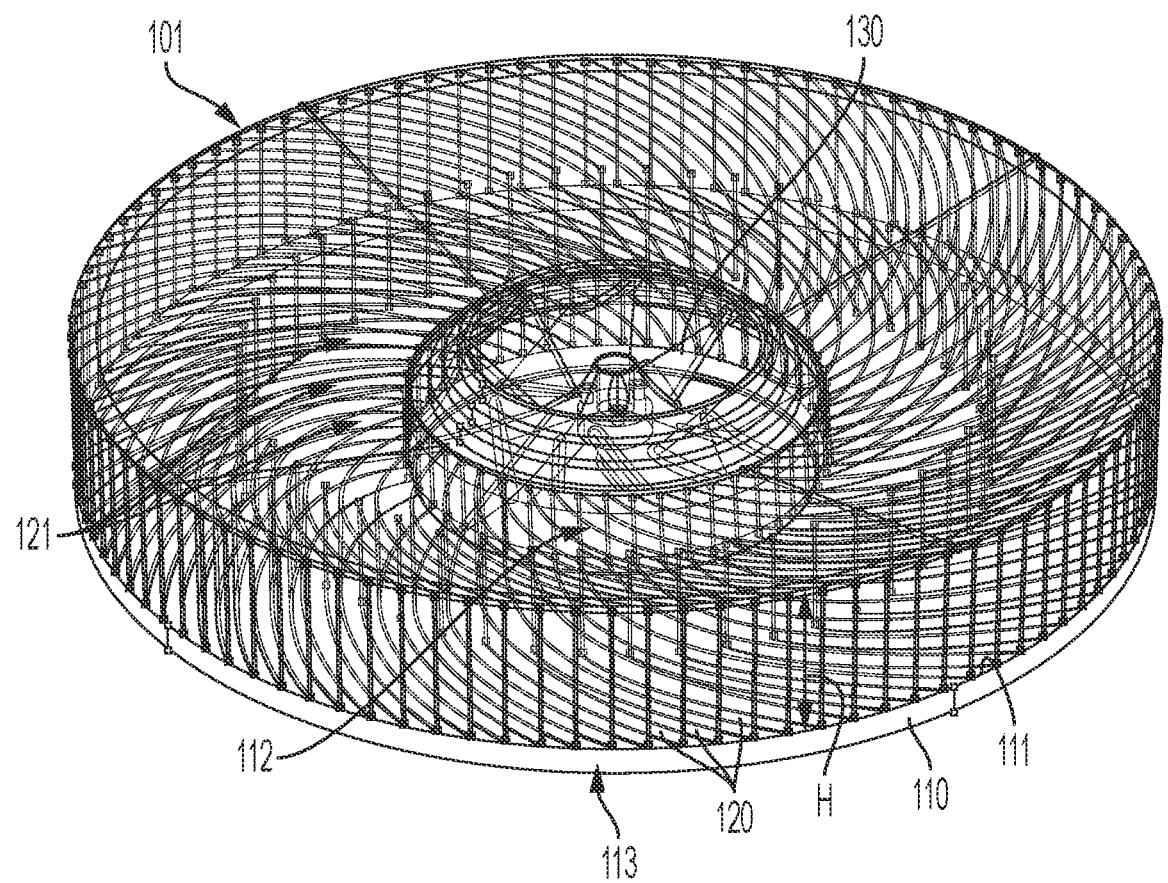
FIG. 1 is a perspective view of a heat exchanger system with an integrated blower in accordance with embodiments.
Figure 2:
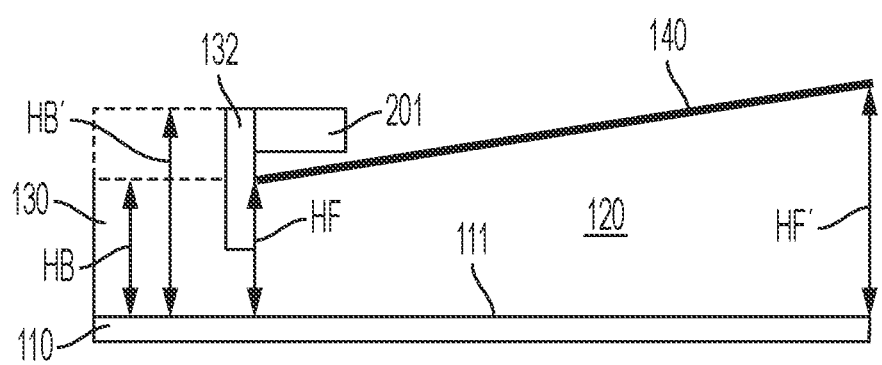
FIG. 2 is a side view of a heat exchanger system with an integrated blower in accordance with embodiments.

With reference to FIG. 1 and FIG. 2, a heat exchanger system 101 is provided and includes a heat sink 110, fins 120 and an integrated blower 130 The heat sink 110 can be, but is not required to be, planarized and has a surface 111 with a central region 112 and a periphery 113. The fins 120 are arrayed on the surface 111 to form channels 121 between adjacent fins 120. Each of the fins 120 extends along the surface 111 from the central region 112 toward the periphery 113. Each of the fins 120 has a height H that is defined in a direction normal to the surface 111 and increases with increasing distance from the central region 112. As such, the channels 121 extend between each pair of the adjacent fins 120 along the surface 111 from the central region 112 toward the periphery 113 and increase in height from the surface 111 with increasing distance from the central region 112. The integrated blower 130 can be provided as a radial blower and is disposed at the central region 112 to generate flows of coolant (e.g., air, gas, liquid, two-phase flows or combinations thereof) directed into and through the channels 121.

With reference to FIG. 2, the heat exchanger system 101 can further include a cover plate 140 to at least partially enclose the channels 121. In accordance with embodiments, the cover plate 140 can cover or abut with at least upper edges of the fins 120. In these or other cases, the channels 121 (see FIG. 1) are defined circumferentially or laterally between each pair of the adjacent fins 120 and in a heightwise dimension between the surface 111 and the cover plate 140.

With continued reference to FIG. 2, the integrated blower 130 can have a height HB that is similar to or different from respective heights HF of the fins 120 at the central region 112. For example, in accordance with embodiments, the integrated blower 130 has a height HB' that exceeds respective heights HF of the fins 120 at the central region 112, though it is to be understood that the height HB' of the integrated blower 130 does not exceed a maximum height HF' of any of the fins 120. In addition, in those cases in which the integrated blower 130 has a height HB', the integrated blower 130 includes an inlet 132 which extends along a substantial fraction of the height HB' of the integrated blower 130.

The packaging illustrated in FIG. 2 allows for a motor 201 to be packaged around a top or upper portion of the integrated blower 130 where respective heights HF of the fins 120 are relatively short and provide for space for the motor 201. The motor 201 is disposed and configured to drive operations of the integrated blower 130. In this way, the total height of the integrated blower 130 and the motor 201 can be encompassed within the maximum height HF' of any of the fins 120.

Figure 3:
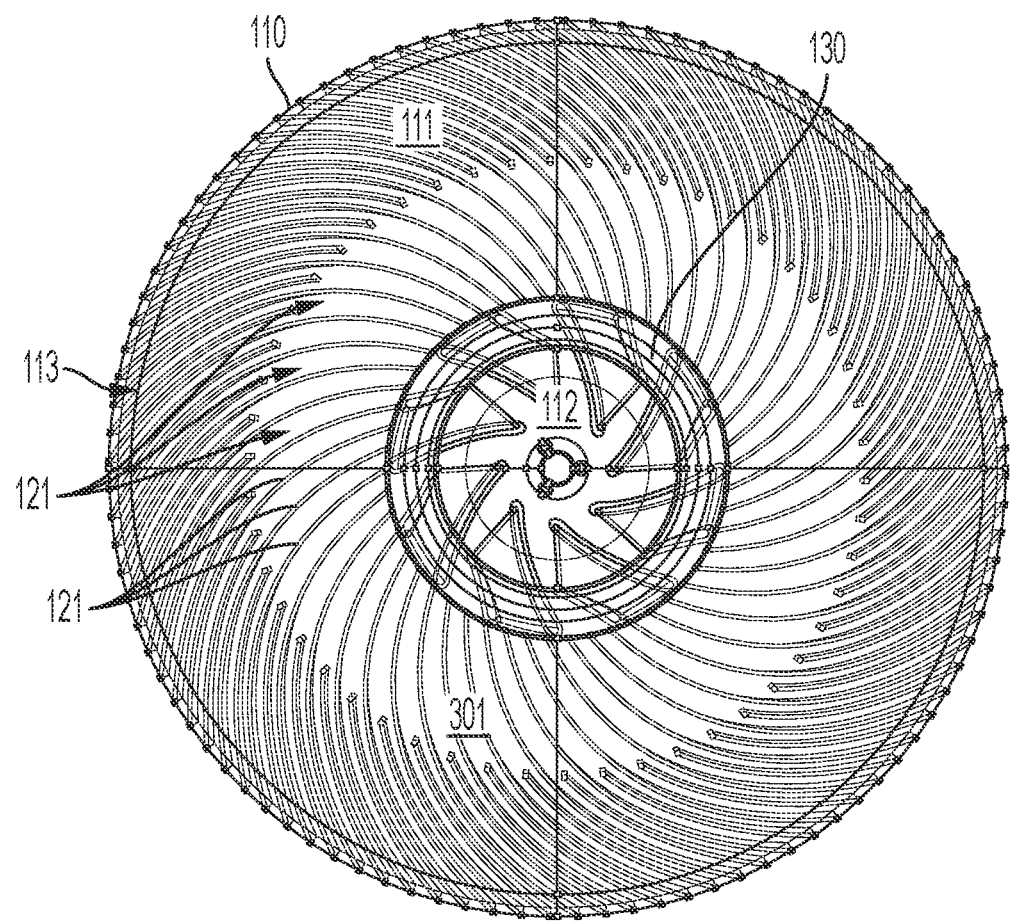
FIG. 3 is a top down view of a heat exchanger system with an integrated blower in accordance with embodiments.

With reference to FIG. 3, the fins 120 can be arranged in a spiraling formation 301 that is generally defined about the central region 112. In these or other cases, it is to be understood that each individual fin 120 need not extend an entire distance from the central region 112 to the periphery 113 in the spiraling formation 301 or otherwise. Moreover, in those instances where one or more fins 120 extend only partially from the central region 112 to the periphery 113, the overall number and configuration of the fins 120 establishes the overall shape of the fins 120.

Figure 4:
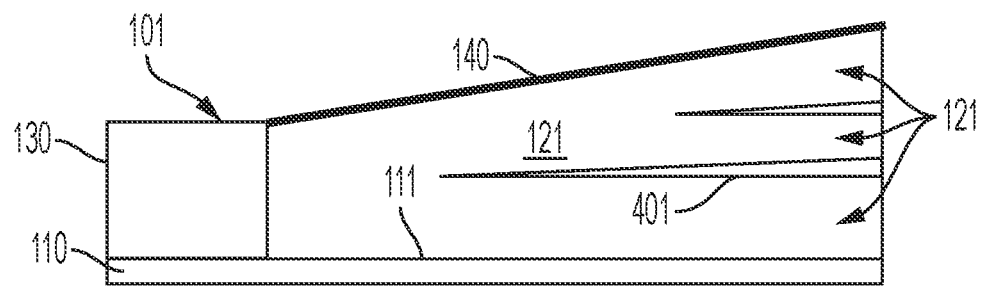
FIG. 4 is a side down view of a heat exchanger system with an integrated blower and baffles between adjacent fins in accordance with embodiments.

With reference to FIG. 4 and in accordance with embodiments, the heat exchanger system 101 can further include one or more baffles 401. In these or other cases, each of the one or more baffles 401 can be disposed to extend between one or more of the adjacent fins 120. In that position, each of the one or more baffles 401 can act to bifurcate the corresponding channel 121 and/or to spoil, control or otherwise redirect the flow of coolant (e.g., air, gas, liquid, two-phase flows or combinations thereof) through the corresponding channel 121.

In accordance with embodiments, in cases where more than one baffle 401 is provided in a channel 121 or in the heat exchanger system 101 as a whole, the baffles 401 can start at different positions in the corresponding channel(s). For example, multiple baffles 401 can be provided in a channel 121 such that the channel 121 is bifurcated into two channels 121, with those two channels 121 being bifurcated into additional channels 121 downstream.

Figure 5:
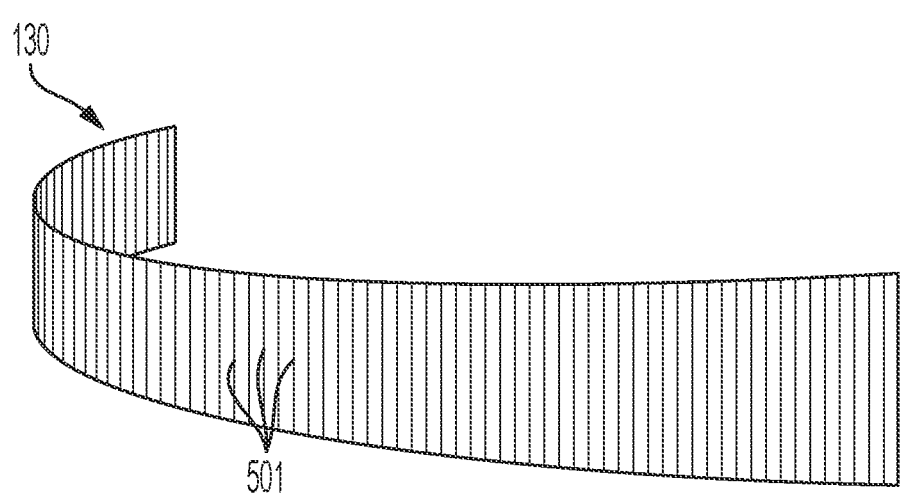
FIG. 5 is a perspective view of a fin of a heat exchanger system with surface features in accordance with embodiments.

With reference to FIG. 5 and in accordance with further embodiments, at least one or more of the fins 120 of the heat exchanger system 101 can include one or more surface features 501 to thermally interact with the flows of the coolant. As shown in FIG. 5, these surface features 501 can be provided as any one or more of surface roughness, turbulators, secondary fins, ribs, dimples, etc. Where applicable, the surface features 501 can also be provided on one or more of the baffles 401 of FIG. 4.

Technical effects and benefits of the present disclosure are the provision of a diffuser-fin heat sink with an integrated blower that is characterized in that a channel height along a flow path is increased to enable more diffusion of coolant and thus greater pressure recovery. The result is lower input power, smaller size and a smaller heat sink size. Due to the integrated blower, the heat exchanger system in an overall sense becomes a very compact and clean package. This has advantages in component volume reduction and also system-level simplicity by integrating the heat exchanger and fan into one component.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:
1. A heat exchanger system, comprising:
a heat sink;
fins arrayed on a central region of the heat sink to form channels between adjacent fins, the fins being arranged in a spiraling formation and each of the fins extending radially outwardly from the central region and having a height that steadily increases with increasing distance from the central region;

an integrated blower disposed at the central region to generate flows of coolant directed into and through the channels; and one or more baffles disposed to extend between adjacent fins, each baffle tapering to a narrow leading edge with decreasing distance toward the central region and bifurcating the corresponding one of the channels between the adjacent fins in a height-wise dimension of the fins.

2. The heat exchanger system according to claim 1, further comprising a cover plate to enclose the channels.

3. The heat exchanger system according to claim 1, wherein the integrated blower comprises a radial blower.

4. The heat exchanger system according to claim 1, wherein the integrated blower has a height that is similar to or in excess of respective heights of the fins at the central region.

5. The heat exchanger system according to claim 4, wherein the height of the integrated blower does not exceed a maximum height of any of the fins.

6. The heat exchanger system according to claim 4, further comprising a motor packaged around an upper portion of the integrated blower to drive operations of the integrated blower.

7. The heat exchanger system according to claim 4, wherein the integrated blower comprises an inlet which extends along a substantial height of the integrated blower.

8. The heat exchanger system according to claim 1, wherein at least one or more of the fins and the one or more baffles comprise one or more surface features to thermally interact with the flows of the coolant.

9. A heat exchanger system, comprising:
a heat sink having a surface with a central region and a periphery;

fins arrayed on the surface to form channels between adjacent fins, the fins being arranged in a spiraling formation and each of the fins extending along the surface from the central region toward the periphery and having a height that is defined in a direction normal to the surface and steadily increases with increasing distance from the central region such that the channels extend along the surface from the central region toward the periphery and steadily increase in height from the surface with increasing distance from the central region; and an integrated blower disposed at the central region to generate flows of coolant directed into and through the channels; and one or more baffles disposed to extend between adjacent fins, each baffle tapering to a narrow leading edge with decreasing distance toward the central region and bifurcating the corresponding one of the channels between the adjacent fins in a height-wise dimension of the fins.

10. The heat exchanger system according to claim 9, further comprising a cover plate to enclose the channels.

11. The heat exchanger system according to claim 9, wherein the integrated blower comprises a radial blower.

12. The heat exchanger system according to claim 9, wherein:
the integrated blower has a height that is similar to or in excess of respective heights of the fins at the central region, and the height of the integrated blower does not exceed a maximum height of any of the fins.

13. The heat exchanger system according to claim 12, further comprising a motor packaged around an upper portion of the integrated blower to drive operations of the integrated blower.

14. The heat exchanger system according to claim 12, wherein the integrated blower comprises an inlet which extends along a substantial height of the integrated blower.

15. The heat exchanger system according to claim 9, wherein at least one or more of the fins and the one or more baffles comprise one or more surface features to thermally interact with the flows of the coolant.

16. The heat exchanger system according to claim 1, wherein:
multiple baffles are disposed to extend between a pair of adjacent fins,
respective leading edges of the multiple baffles extend toward the central region, and
the leading edge of a higher one of the multiple baffles recedes further from the central region than the leading edge of a lower one of the multiple baffles.

17. The heat exchanger system according to claim 8, wherein the one or more surface features of one of the fins are provided along an entirety of a length of the one of the fins.

18. A heat exchanger system, comprising:
a heat sink;
fins arrayed on a central region of the heat sink to form channels between adjacent fins, the fins being arranged in a spiraling formation and each of the fins extending radially outwardly from the central region and having a height that steadily and linearly increases with increasing distance from the central region;

an integrated blower disposed at the central region to generate flows of coolant directed into and through the channels; and one or more baffles disposed to extend between adjacent fins, each baffle tapering to a narrow leading edge with decreasing distance toward the central region and bifurcating the corresponding one of the channels between the adjacent fins in a height-wise dimension of the fins.

* * * * *